(12) United States Patent
Ivanov et al.

(10) Patent No.: US 8,461,600 B2
(45) Date of Patent: Jun. 11, 2013

(54) METHOD FOR MORPHOLOGICAL CONTROL AND ENCAPSULATION OF MATERIALS FOR ELECTRONICS AND ENERGY APPLICATIONS

(75) Inventors: Ilia N. Ivanov, Knoxville, TN (US); John T. Simpson, Clinton, TN (US)

(73) Assignee: UT-Battelle, LLC, Oak Ridge, TN (US)

(*) Notice: Subject to any disclaimer, the term of this patent is extended or adjusted under 35 U.S.C. 154(b) by 314 days.

(21) Appl. No.: 12/558,129

(22) Filed: Sep. 11, 2009

(65) Prior Publication Data
US 2011/0062410 A1 Mar. 17, 2011

(51) Int. Cl.
*H01L 33/00* (2010.01)

(52) U.S. Cl.
USPC .............................. 257/88; 438/585

(58) Field of Classification Search
USPC .......... 257/88, E51.04, 84, 100, 98, E25.001; 438/585
See application file for complete search history.

(56) References Cited

U.S. PATENT DOCUMENTS

| | | | |
|---|---|---|---|
| 3,953,131 A | 4/1976 | Britz | 356/141 |
| 4,422,863 A * | 12/1983 | Hosoya et al. | 65/110 |
| 4,886,537 A | 12/1989 | Patrick | 65/4.3 |
| 4,912,314 A | 3/1990 | Sink | |
| 5,110,334 A * | 5/1992 | Ayers | 65/444 |
| 5,400,136 A | 3/1995 | Vo-Dinh | |
| 6,532,326 B1 | 3/2003 | Hutchinson et al. | |
| 6,552,842 B2 | 4/2003 | Simpson et al. | |
| 6,661,952 B2 | 12/2003 | Simpson et al. | |
| 6,709,566 B2 * | 3/2004 | Cumings et al. | 205/641 |
| 6,757,463 B2 | 6/2004 | Hutchinson et al. | |
| 6,853,669 B2 | 2/2005 | Simpson et al. | |
| 7,139,072 B1 | 11/2006 | Boss et al. | |
| 7,150,904 B2 * | 12/2006 | D'Urso et al. | 428/116 |
| 7,258,731 B2 | 8/2007 | D'Urso et al. | |
| 7,267,948 B2 | 9/2007 | Vo-Dinh | |
| 7,312,088 B2 | 12/2007 | Farquharson | |
| 7,312,875 B2 | 12/2007 | Hanson et al. | |
| 7,351,588 B2 | 4/2008 | Poponin | |
| 7,767,564 B2 * | 8/2010 | Dutta | 438/585 |
| 2002/0121856 A1 | 9/2002 | Tsai | |
| 2005/0109918 A1 | 5/2005 | Nikzad et al. | |
| 2005/0196775 A1 * | 9/2005 | Swager et al. | 435/6 |
| 2005/0264157 A1 | 12/2005 | Sakai et al. | |
| 2005/0268962 A1 | 12/2005 | Gaudiana et al. | 136/255 |

(Continued)

OTHER PUBLICATIONS

Xuejun Zhang et al., "*Mass-Productions of vertically Aligned Extremely Long Metallic Micro/Nanowires Using Fiber Drawing Nanomanufacturing*", Advanced Materials, 2008, pp. 105.

(Continued)

*Primary Examiner* — Julio J Maldonado
*Assistant Examiner* — Robert Bachner
(74) *Attorney, Agent, or Firm* — Brinks Hofer Gilson & Lione (57) ABSTRACT

An electronic device comprises a drawn glass tube having opposing ends, a semiconductive material disposed inside of the drawn glass tube, and a first electrode and a second electrode disposed at the opposing ends of the drawn glass tube. A method of making an electrical device comprises disposing a semiconductive material inside of a glass tube, and drawing the glass tube with the semiconductive material disposed therein to form a drawn glass tube. The method of making an electrical device also comprises disposing a first electrode and a second electrode on the opposing ends of the drawn glass tube to form an electric device.

15 Claims, 12 Drawing Sheets

U.S. PATENT DOCUMENTS

| | | | |
|---|---|---|---|
| 2006/0017917 | A1 | 1/2006 | Cullum et al. |
| 2006/0023451 | A1* | 2/2006 | Han et al. ............... 362/249 |
| 2006/0034729 | A1 | 2/2006 | Poponin |
| 2006/0252065 | A1 | 11/2006 | Zhao et al. |
| 2006/0279191 | A1 | 12/2006 | Geohegan et al. |
| 2006/0289380 | A1 | 12/2006 | D'Urso et al. |
| 2007/0048249 | A1 | 3/2007 | Youngblood et al. |
| 2007/0131266 | A1 | 6/2007 | Dutta |
| 2007/0155021 | A1 | 7/2007 | Zhang et al. |
| 2007/0164270 | A1 | 7/2007 | Majumdar et al. ............ 257/14 |
| 2008/0026188 | A1 | 1/2008 | D'Urso et al. |
| 2008/0061689 | A1 | 3/2008 | Ohkubo et al. |
| 2008/0080816 | A1 | 4/2008 | D'Urso et al. |
| 2008/0144026 | A1 | 6/2008 | Zhao et al. |
| 2008/0160865 | A1 | 7/2008 | Wei et al. |
| 2008/0169016 | A1* | 7/2008 | Dutta ...................... 136/238 |
| 2008/0191606 | A1 | 8/2008 | Geohegan et al. |
| 2008/0198376 | A1 | 8/2008 | Poponin |
| 2008/0296252 | A1 | 12/2008 | D'Urso et al. |
| 2009/0042469 | A1 | 2/2009 | Simpson |

OTHER PUBLICATIONS

Andris V. Bune et al., "*Materials Research in Low Gravity*", SPIE—The International Society for Optical Engineering, vol. 3123, 1997, 12 pgs.

Reinhold J. Dorn et al. "*Design of the Crires 512 X4096 Pixels Aladdin InSb Focal Plane Array Detector Mosaic*", European Southern Observatory, 4 pgs., (2002).

Zhihua Xu et al., "*Carbon nanotube effects on electroluminescence and photovoltaic response in conjugated polymers*", Applied Physics Letters 87, 263118 (2005), 3pgs.

Yu. A. Goldberg, "*Handbook Series on Semiconductor Parameters*", vol. 1, M. Levinshtein, S. Rumyantsev and M. Shur, ed, World Scientific, London, 1996, pp. 191-213.

Yue Wang et al. "*Growth and properties of 40 mm diameter Hg1-xCdxTe using the two-stage Pressurized Bridgman Method*", Journal of Crystal Growth, vol. 273, Issues 1-2, Dec. 17, 2004, pp. 54-62.

Yue Wang et al., "*A two-stage technique for single crystal growth of HgCdTe using a pressurized Bridgman method*", Journal of Crystal Growth, vol. 263, Issues 1-4, Mar. 1, 2004, pp. 273-282.

A. Rogalski, "*HgCdTe infrared detector material: history, status and outlook*", Institute of Physics Publishing, Reports on Progress in Physics, vol. 68, 2005, pp. 2267-2336.

D. F. Gibbons, "*Thermal Expansion of Some Crystals with the Diamond Structure*", Physical Review, vol. 112, No. 1,, Oct. 1, 1958, pp. 136-140.

* cited by examiner

METHOD FOR MORPHOLOGICAL CONTROL AND ENCAPSULATION OF MATERIALS FOR ELECTRONICS AND ENERGY APPLICATIONS

This invention was made with government support awarded by the U.S. Department of Energy. The government has certain rights in the invention.

The present disclosure is related to U.S. patent application Ser. No. 12/558,101 to Ivanov et al., filed on the same date as this disclosure, entitled "Method Of Making Large Area Conformable Shape Structures For Detector/Sensor Applications Using Glass Drawing Technique And Postprocessing" and commonly owned by the assignee of the present disclosure, the entirety of which is hereby incorporated by reference. The present disclosure is also related to U.S. patent application Ser. No. 12/558,145 to Ivanov et al., filed on the same date as this disclosure, entitled "Design Of Large Area Substrate For Surface Enhanced Raman Spectroscopy (SERS) Using Glass-Drawing Technique" and commonly owned by the assignee of the present disclosure, the entirety of which is hereby incorporated by reference.

TECHNICAL FIELD

The present disclosure relates to a method for morphological control and encapsulation of materials for electronics and energy applications, and devices containing the materials.

BACKGROUND

Transparent conducting coatings are used in display technologies, optics, electromagnetic shielding and many other applications. A widely used coating is indium tin oxide (ITO), which is inflexible and requires high processing temperatures to fabricate.

Conventional organic light emitting diodes (OLEDs) may be either small molecule OLED or polymer OLED. Soluble light emitting polymers can be used for manufacturing large area light emitting devices. Other methods, such as screen and inkjet printing, have been used for manufacturing large area lighting, patterning, and display applications.

While the emissive electroluminescent layer is polymeric, varying numbers of OLEDs can be deposited in arrays on a screen using printing methods to create a graphical color display, for use as television screens, computer displays, advertising and information board applications, and the like. OLED may also be used in lighting devices.

BRIEF SUMMARY OF THE INVENTION

In one aspect, an electronic device comprises a drawn glass tube having opposing ends, a semiconductive material disposed inside of the drawn glass tube, and a first electrode and a second electrode disposed at the opposing ends of the drawn glass tube.

In another aspect, an electronic device comprises a drawn glass tube having opposing ends, a semiconductive material disposed inside of the drawn glass tube, and a first electrode disposed inside of the drawn glass tube with the semiconductive material disposed thereupon. The electronic device also comprises a second electrode disposed outside of the drawn glass tube.

In yet another aspect, a method of making an electrical device comprises disposing a semiconductive material inside of a glass tube, and drawing the glass tube with the semiconductive material disposed therein to form a drawn glass tube. The method of making an electrical device also comprises disposing a first electrode and a second electrode on the opposing ends of the drawn glass tube to form an electric device.

DETAILED DESCRIPTION OF THE PREFERRED EMBODIMENTS

The present disclosure is directed to a method for morphological control and encapsulation of materials for electronics and energy applications, and devices containing the materials. The materials can be encapsulated in drawn glass tubes. The drawn glass tubes containing the materials can be conformed to various shapes, depending upon their applications. The devices can be used in electronics and energy applications, such as organic photovoltaic (OPV) and OLED manufacturing.

Figure 1A:
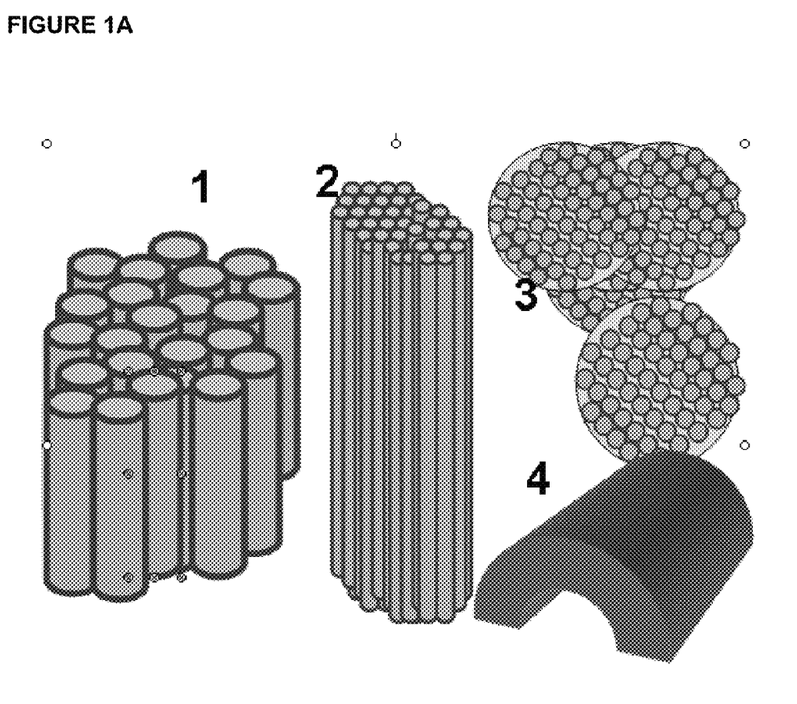
FIG. 1 is a not-to-scale schematic view of the method of making a drawn glass tube for electronic devices.
Figure 1B:
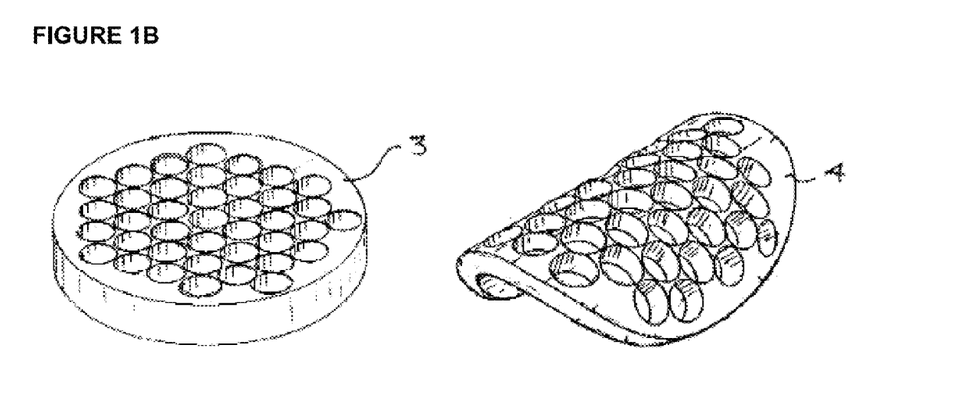
Figure 1C:
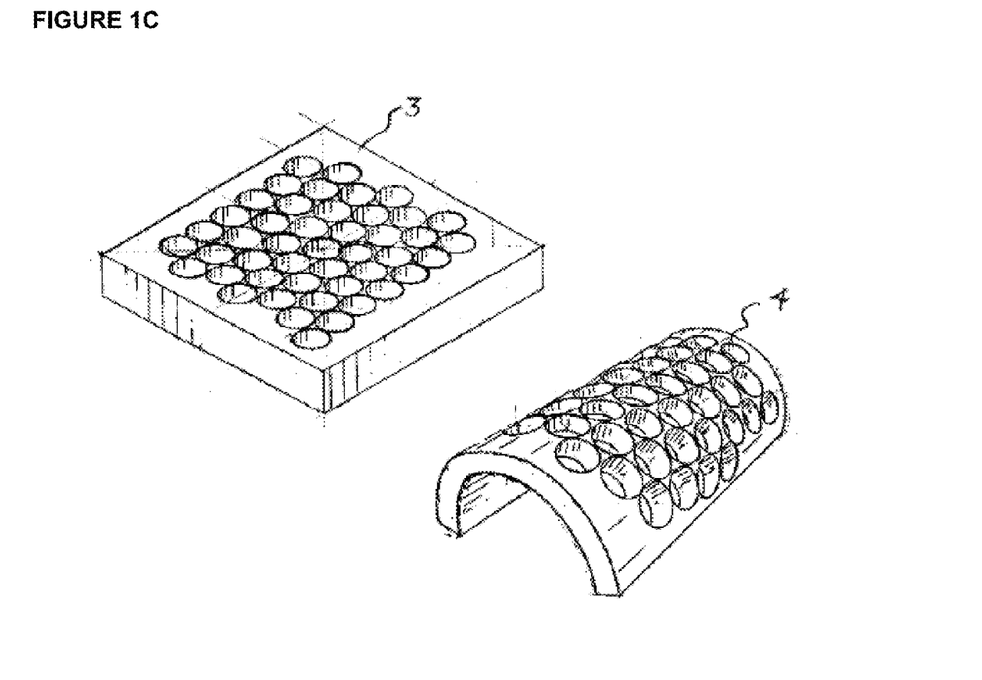

Morphological Control and Encapsulation of Materials Using Glass Drawing Techniques Referring to FIG. 1A-1C, a bundle of tubes 1 is formed from a plurality of single dielectric tubes, such as glass tubes. The bundle of glass tubes 1 is drawn, and redrawn if needed, to form a plurality of drawn glass tubes 2. The drawn glass tubes 2 are cut to form cut drawn glass tubes 3. The cut drawn glass tubes 3 can have any shape, such as plates, tiles, or disks. In one example, the drawn glass tubes 2 are cut into disks 3. Herein, the term "drawn glass tubes" may refer to either drawn glass tubes 2 or cut drawn glass tubes 3. The bundling, drawing, cutting, and shaping processes will be described in detail below.

Any suitable dielectric tubes can be used to prepare the cut drawn glass tubes. For example, the dielectric tubes can be hollow glass tubes. Any suitable type of glass tubes can be used. The bundled drawn glass tubes collectively can assume any shape, such as a circle, a square, a rectangle, an oval, a triangle, a hexagonal shape, or an irregular shape. The bundled cut drawn glass nanotubes collectively can assume any shape in the transverse direction of the nanotubes, such as a circle, a square, a rectangle, an oval, a triangle, a hexagonal shape, or an irregular shape.

Figure 5A:
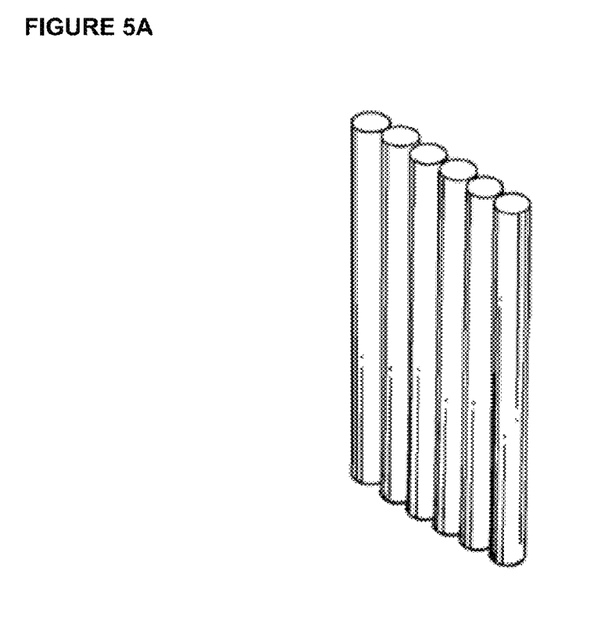
FIG. 5 is a not-to-scale schematic view of various designs of the drawn glass tubes for electronics and energy applications.
Figure 5B:
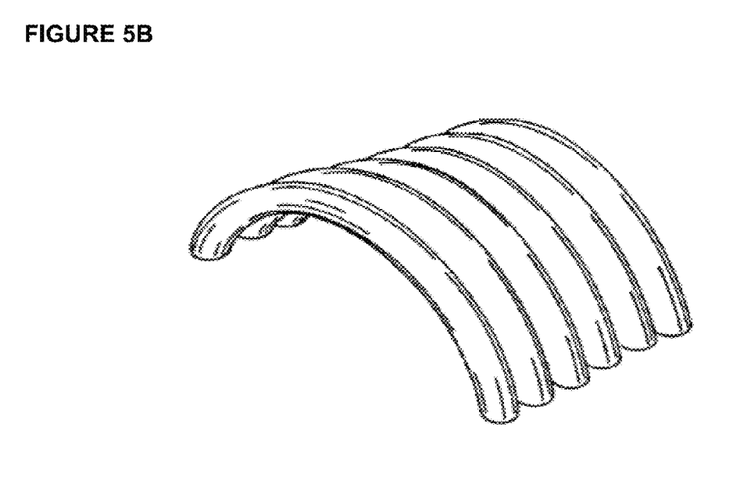

The shape and size of the glass drawn tubes may vary, and can be conformed, depending upon the applications the glass drawn tubes are used for. For example, referring to FIG. 5, the tubes can be drawn and shaped to be cylindrical, or bent. The tubes can be in the form of a sheet, or a bundle with various shapes. The respective ends of the tubes can also be conformed to various shapes. Any suitable shaping method can be used. In one example, the ends of the tubes are shaped by heating and negative shape model. In another example, the ends of the shape tubes are conformed into a curved shape at one end either by attaching the tubes to a rigid, curved substrate or by applying a force through air pressure, a balloon, vacuum, or piezoelectric tranducer (PZT).

Figure 2:
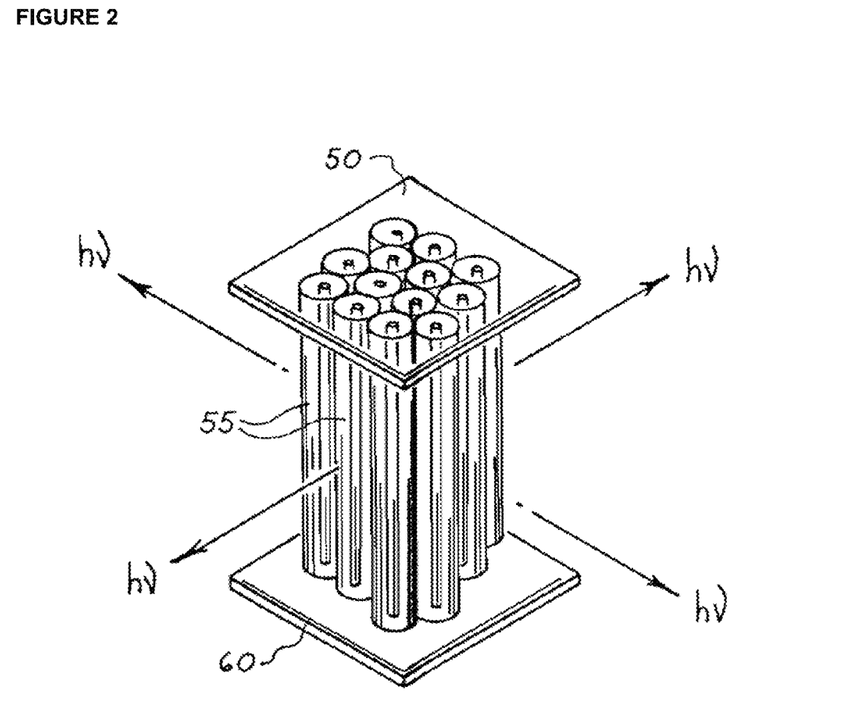
FIG. 2 is a not-to-scale schematic view of an electronic device that contains drawn glass tubes.

Referring to FIG. 2, in one embodiment, the glass drawn tubes can be used in an optoelectronic device, such as an organic light emitting diode (OLED) device or an organic photovoltaic (PV) device. The device comprises a plurality of bundled drawn glass tubes 2. The diameter of the individual drawn glass tube is determined by the drawing ratio, and can be reduced down to submicron size (e.g., less than about 1 micron) or nanometer size (e.g. less than about 100 nm). The bundled glass tubes 2 contain a semiconductive material. Preferably, the semiconductive material is a semiconductive polymer 55. Preferably, the semiconductive polymer comprises polymer nanocomposites. The polymer 55 either substantially fills the tubes or is disposed on the inner walls of the tubes and there is an empty space inside of the tubes with the polymers 55 disposed therein. Preferably, the semiconductive material is encapsulated in the bundled glass tubes 2. Any suitable glass encapsulating method can be used.

A first electrode 50 and a second electrode 60 are disposed on the two opposing ends of the bundled glass tubes 2 to form a vertical electronic device. The first electrode 50 and the second electrode 60 can be either transparent or non-transparent. Any suitable electrode material can be used for the first electrode 50 and the second electrode 60. The vertical electronic devices can have more surface area than conventional flat electronic devices.

Any suitable metal or composite of metals can be used for the electrodes. In one example, transparent metals such as ITO are used. In another example, non-transparent metals which allows larger offset of electrode potentials are used. The size and shape of the drawn glass tubes 2 can vary, which allows the fabrication of large area vertical electronic devices of various sizes.

The semiconductive polymer may be composed of any polymer material that emits light in response to an electric current or an electric field, examples of which include, but are not limited to, poly(phenylene vinylene), polythiophenes, polypyridines, poly(pyridyl vinylenes), polyphenylenes and copolymers of these materials. In one embodiment, the polymer is a conjugated polymer. Conjugated polymers have a framework of alternating single and double carbon-carbon and/or carbon-nitrogen bonds or carbon-sulfur bonds.

The semiconductive polymer can be disposed inside the glass tubes either before or after the drawing process via any suitable method, such as infiltration, back-filling or synthesis. For example, the polymer can be disposed inside the glass tubes after the drawing process by back infiltration/filling.

The semiconductive polymer can further comprise nanaomaterials, such as nanotubes, that improve the light-emitting (electroluminescence) and photovoltaic response of composite polymers. For example, the nanotubes incorporated in the semiconductive polymer may facilitate charge injection and dissociating excitons of the polymer nanocomposites. The improved response allows the fabrication of larger PV and OLED devices. In one example, the nanotubes inside the device are used as an electrode. The nanotubes may be transparent inside the glass tubes. In another example, the nanotubes are used as a collector electrode inside the nanocomposites.

Various suitable nanaomaterials, such as nanotubes, and their applications in the electronic devices are described in detail below and in U.S. Patent Publication No. 2008/0191606, the entirety of which is hereby incorporated by reference.

Figure 3A:
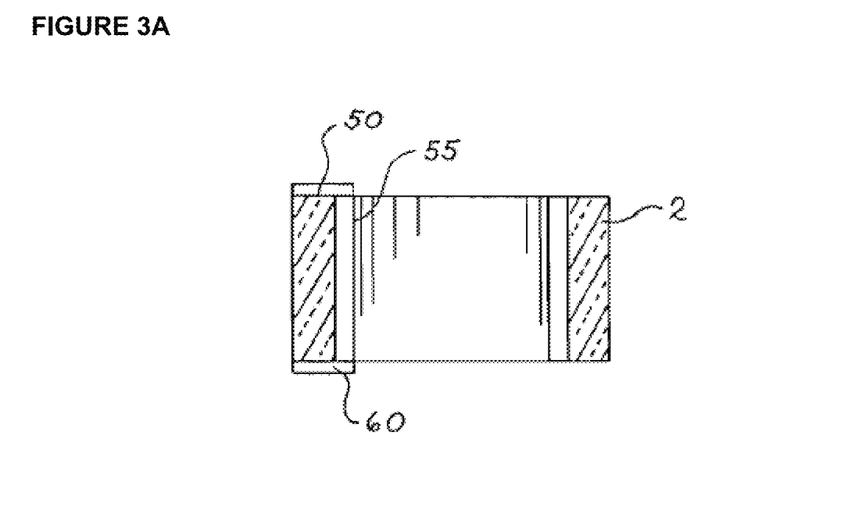
FIG. 3 is a not-to-scale schematic view of an electronic device according to one embodiment.
Figure 3B:
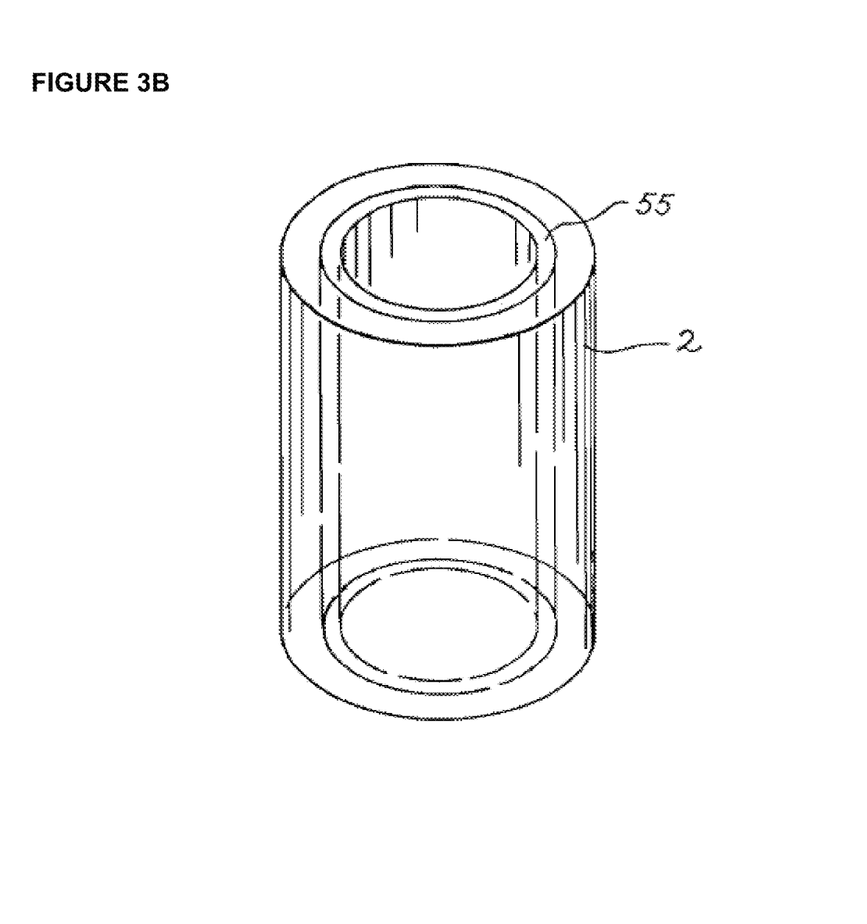
Figure 3C:
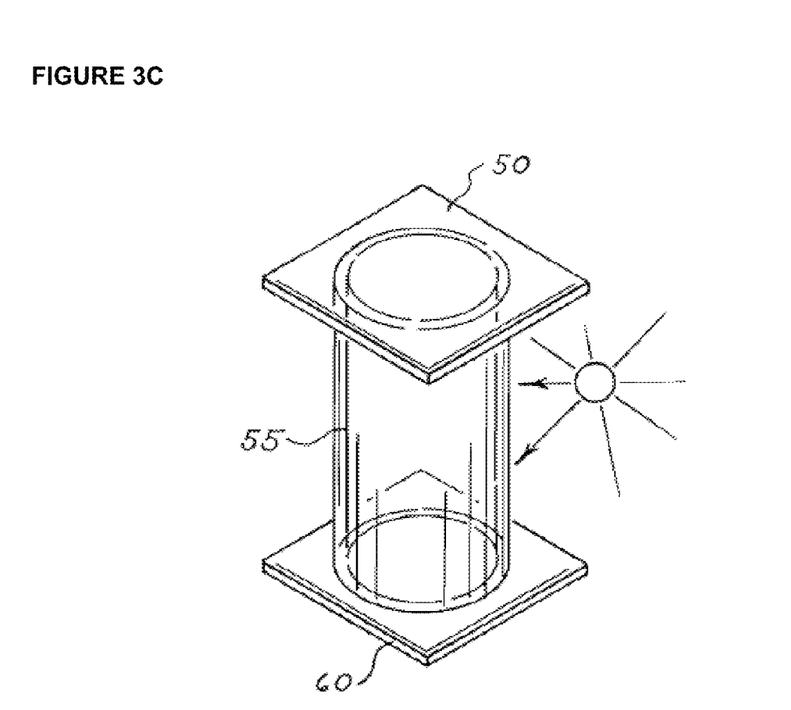

Referring to FIG. 3A-3C, in another embodiment, a wide drawn glass tube 2 is used in an electronic device. Semiconductive polymer 55 are disposed on the inner walls of the tube 2. Preferably, the polymer is sealed in the bundled glass tubes 2. A first electrode 50 and a second electrode 60 are disposed on the two opposing ends of the bundled glass tube 2. The first electrode 50 and the second electrode 60 can be either transparent or non-transparent. Any suitable electrode material can be used for the first electrode 50 and the second electrode 60.

Figure 4A:
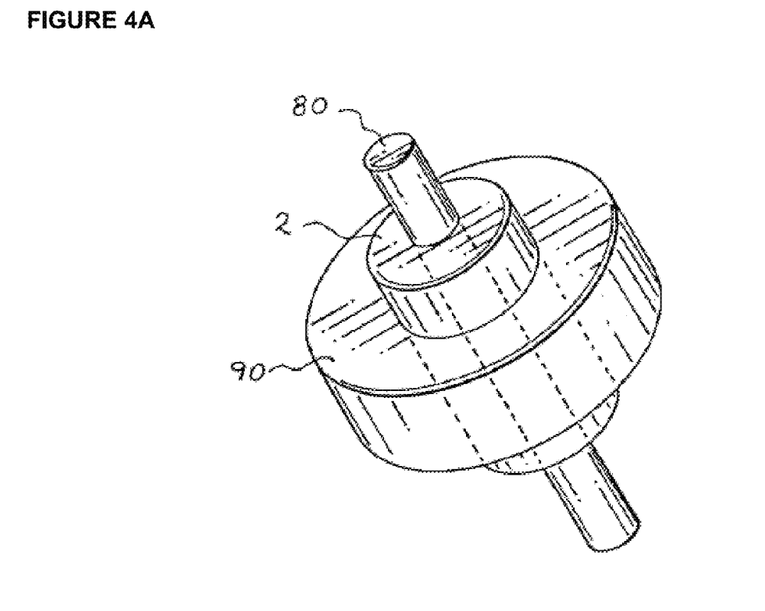
FIG. 4 is a not-to-scale schematic view of an electronic device according to another embodiment.

Referring to FIG. 4A, in yet another embodiment, the cathode electrode 80 is disposed inside of the glass drawn tube 2 with the semiconductive polymer 55. An anode electrode 90 is disposed around the glass drawn tube 2. The cathode electrode 80, the glass drawn tube 2, or the anode electrode 90 can be cylindrical. Preferably, the anode electrode 90 surrounding the glass tube 2 is transparent.

Figure 4B:
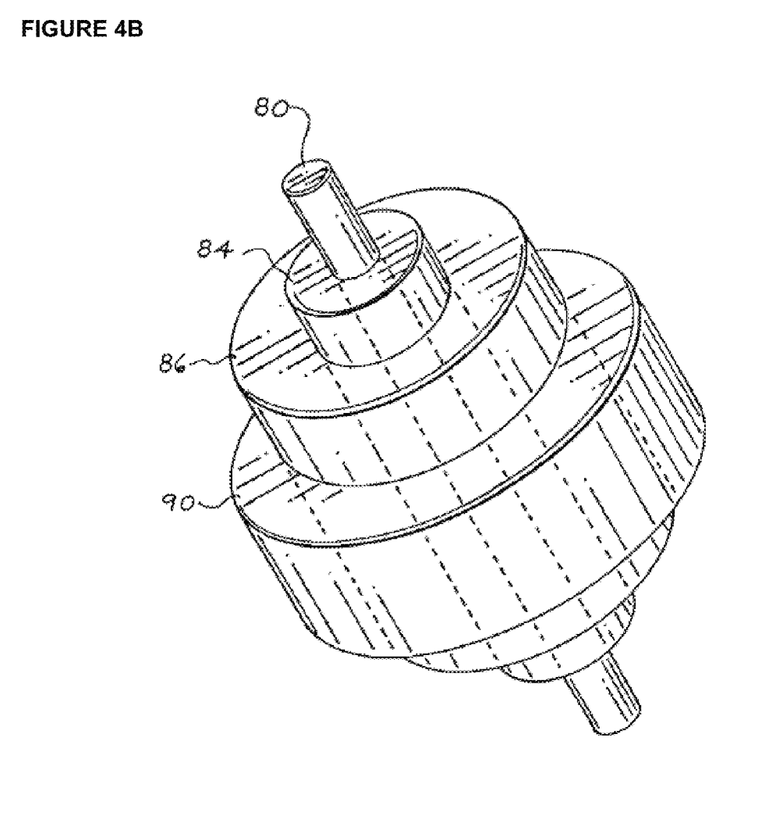

Referring to FIG. 4B, in still yet another embodiment, the cathode electrode 80 is disposed inside of the glass drawn tube 2 with the semiconductive polymer. A donor material 84 and an acceptor material 86 are disposed between the cathode electrode 80 and the semiconductive polymer. An anode electrode 90 is disposed around the glass drawn tube 2. The cathode electrode 80, the glass drawn tube 2, or the anode electrode 90 can be cylindrical. Preferably, the anode electrode 90 surrounding the glass tube 2, the donor material 84, and the acceptor material 86 are transparent.

Figure 4C:
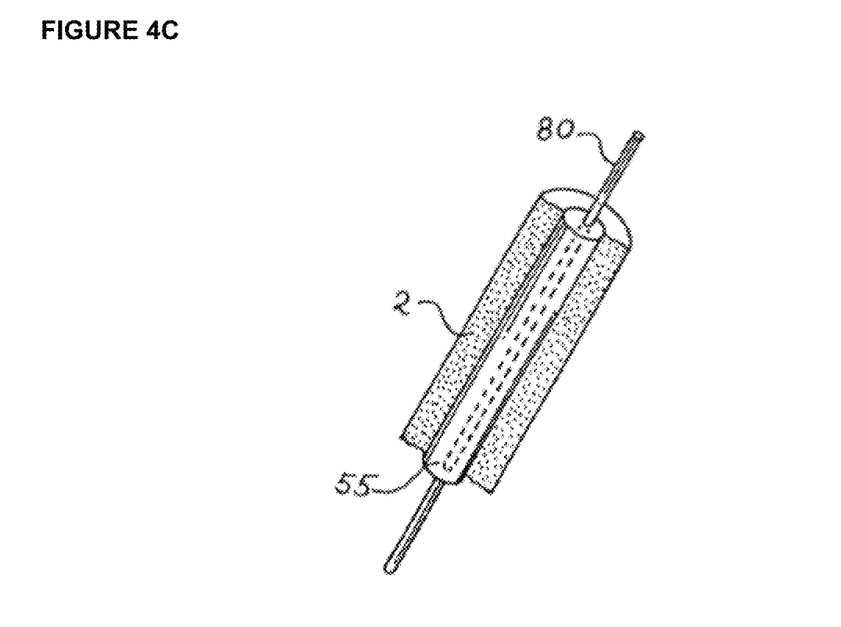

Any suitable method can be used to make the electronic device with drawn glass tubes. Referring to FIG. 4C, in one embodiment, a electrode material 80A is coated with the semiconductive polymer 55. Any suitable coating method known to a person with ordinary skill in the art can be used. The electrode material with the semiconductive polymer coating is disposed inside of a glass tube 2. The glass tube with the coated electrode material is drawn to form the electronic device containing the drawn glass tubes.

Figure 4D:
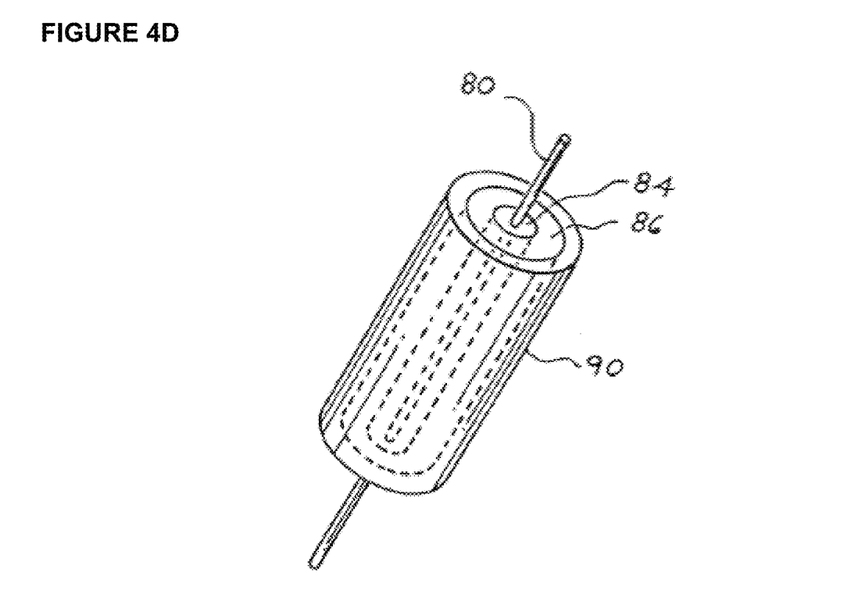

Referring to FIG. 4D, in another embodiment, a donor material 84 and an acceptor material 86 are disposed upon the electrode material 80A sequentially. The electrode material with the donor material 84 and the acceptor material 86 is coated with the semiconductive polymer 55. Any suitable coating method known to a person with ordinary skill in the art can be used. The electrode material with the semiconductive polymer coating is disposed inside of a glass tube 2. The glass tube with the coated electrode material is drawn to form the electronic device containing the drawn glass tubes.

The electronic devices containing glass drawn tubes can be produced at low cost while maintaining or improving high performance over their lifetime. The glass drawing techniques are suitable for large scale manufacturing of large area electronic devices, such as PV and OLED devices, display and general lighting applications. The electronic devices containing glass drawn tubes may have low performance degradation.

The electronic devices containing glass drawn tubes provide an alternative design to replace expensive indium tin oxide as a transparent conducting electrode in organic PV and OLED devices. The encapsulation method used in connection with the glass tubes can be a low cost encapsulating technology to improve or replace ethylene vinyl acetate (EVA) encapsulation technology.

The electronic devices containing glass drawn tubes prepared by the glass drawing techniques can be vertically oriented electrically insulated nanometer-diameter devices. Nanotubes can be added to the semiconductive polymer contained in the glass drawn tubes, which enables long range charge transfer in the semiconducting polymers and thus improves the performance of the electronic devices.

Glass Drawing Techniques

The nanotubes can be prepared by any suitable method, for example, by etching, chemical or physical vapor deposition, laser vaporization, electrical field manipulation, hydrodynamic flow, lithographic techniques, synthetic methods, and glass drawing techniques. Preferably, the nanotubes are prepared by glass drawing techniques.

Figure 6:
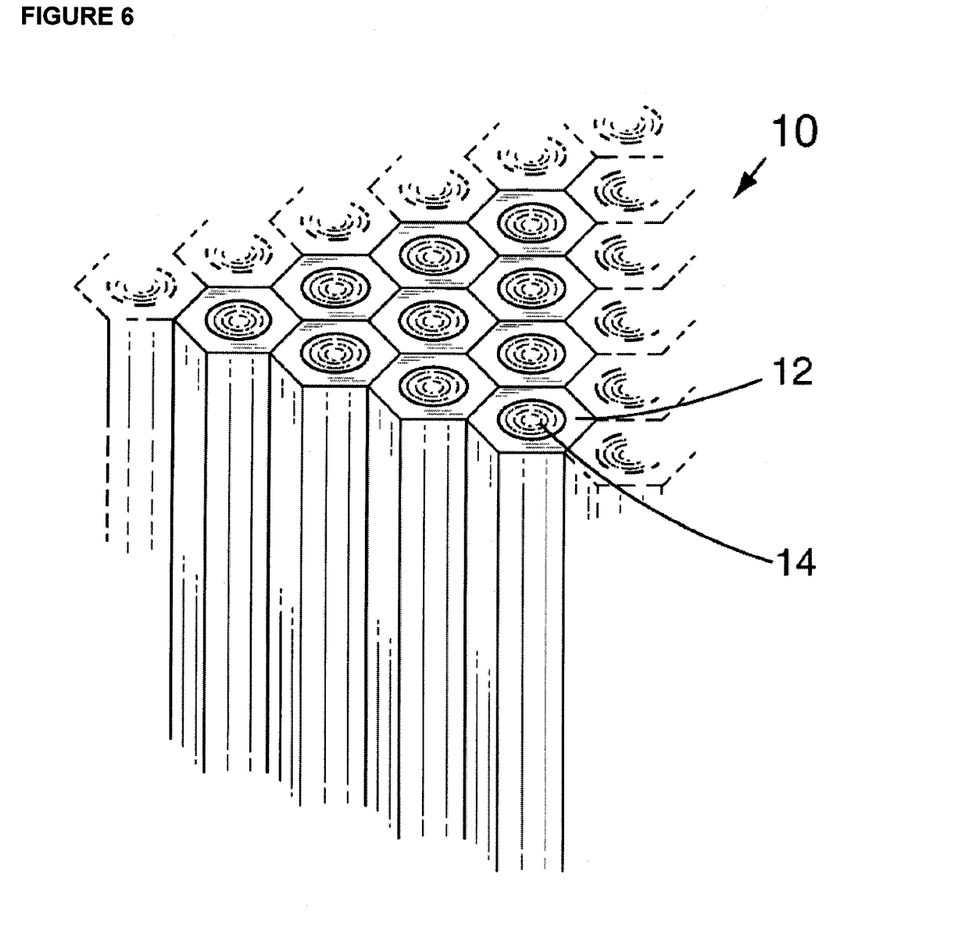
FIG. 6 is a schematic oblique view of a portion of a bundle of composite rods.

In one embodiment, composite glass rods are drawn. Referring to FIG. 6, composite rods comprise a core 14 and a sleeve (the matrix material of the rods) 12. The core 14 comprises a different material than the matrix material 12. The composite rods are bundled in an aligned array, or bundle 10. The rod (matrix material) 12 and the core 14 can assume any shape. Preferably, the rod (matrix material) 12 has a hexagonal or other outer cross-sectional shape to minimize voids while the core 14 preferably has a circular cross-section, although neither of these parameters is considered to be critical. It may be advantageous for economical manufacturing for the matrix material 12 to have a circular cross-section. In this case the voids are filled in during subsequent processing. With round rods 12, the spacing of the core 14 will be somewhat less precise.

The matrix material 12 and core 14 are preferably selected based on differential etchability (susceptibility to etching or dissolution). In the case of the nano-channel glass drawing, the core glass has a much higher etchability than that of the matrix glass. Alternatively, if the core 14 has a lower etchability than the matrix material 12, protrusive, sharp features, such as nanocones and nanospikes, may form upon etching of the composite surface.

It should be noted that the use of immiscible components in the composite may improve the ease of drawing the material. In general it may be advantageous to choose materials with specific miscibility to facilitate drawing without too much inter-diffusion of the materials (excessively miscible) and without either component breaking up into droplets (insufficiently miscible).

The bundle 10 can heated to a temperature sufficient to soften the materials comprising the bundle 10, but low enough to avoid damage, decomposition, or other deleterious changes. The bundle 10 is then drawn along the axis of the bundled rods to fuse and reduce the diameter of the bundle 10. The drawn bundle has reduced size material rod matrix material 12 and respective core 14. The drawn bundle is cut transversely into sections which can be re-bundled to increase the number of core material cores in the cross-section thereof.

The drawn bundle can then be drawn again. The twice-drawn bundle has further reduced size material rod matrix material 12 and respective core 14. The twice-drawn bundle is again cut transversely into sections which are re-bundled to further increase the number of core 14 cores in the cross-section thereof.

The process of bundling, drawing, and cutting can be performed a single time or repeated many times until the desired diameter and spacing of the core 14 are obtained. Core 14 diameters and spacing on the nanometer scale are possible. The sizes of bundles and the number of rods contained therein can be varied throughout the process as desired.

Figure 7:
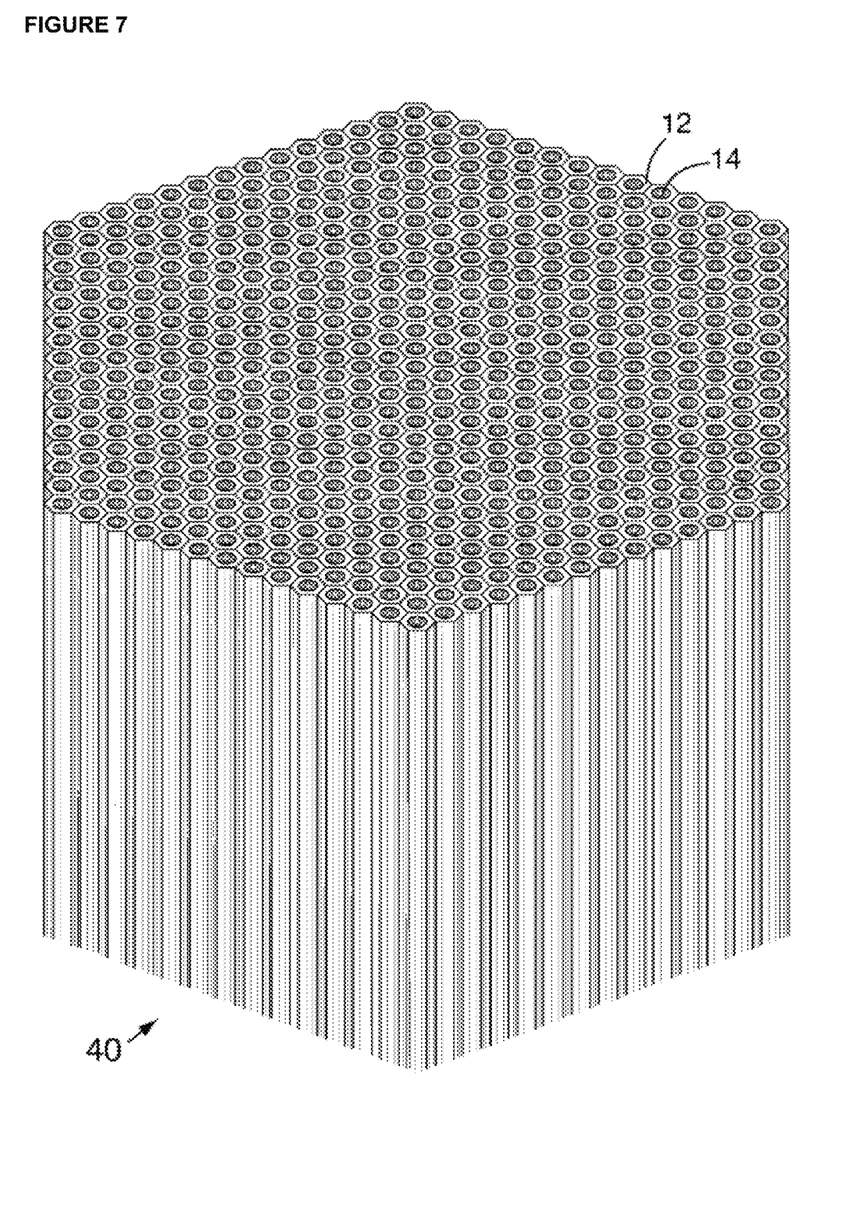
FIG. 7 is a schematic oblique view of the bundle of composite rods shown in FIG. 6 after re-bundling and fusing.

After the final draw (which can be the first draw), the bundle can be cut, bundled, and fused in order to obtain a larger diameter boule. Referring to FIG. 7, the boule 40 can be transversely cut to produce slices (plates, tiles) of any desired thickness. The cut is usually (but not necessarily) perpendicular to the original rods 12 and the drawing direction. One or both cut faces may be polished. Although a hexagonal boule 40 is shown and described as an example, a boule of any desired geometric shape can be formed, processed, and used.

In another embodiment, the composite material may comprise a bundle of more than one kind of composite rod, as described in U.S. Patent Publication No. 2006/0289380, the entirety of which is hereby incorporated by reference. For example, some of the cores may have a different core phase having a high etchability/solubility (e.g., nano-channel-like cores) so that a perforated product may be fabricated.

In yet another embodiment, solid glass rods or hollow glass tubes are used as opposed to composite glass rods. The process of bundling, drawing, and cutting is otherwise performed as described above.

In further another embodiment, glass tubes that contain appropriate filling materials in powder or rod form are drawn. The drawing method according to the embodiment combines fiber drawing method with advanced filling materials, thus providing not only desired functionality, but also excellent controls over the aspect ratio, diameter, length and inter-nanotube spacing of micro/nanotubes.

A preform for drawing may be prepared by pouring powders or inserting a rod into a glass tube. Drawn tubes from the first drawing process are cut into pieces, preferably with substantially equal length, which are bundled together to form a hexagonal bundle for the next drawing cycle. By repeating the drawing-cutting-bundling process for as many, or as few, times as needed, the outer and the inner diameters, and the thickness of the glass tubes may be decreased from centimeters to hundreds nanometers or less.

After the last drawing, the drawn nanotubes are bundled and annealed below the softening temperature of the glass to make a solid rod. In one example, the rod is cut perpendicular to its axis to make plates that have ordered array of micro/nanotubes of the filling materials. If needed, after making encapsulated nanotubes, the glass can be removed by etching, such as hydrogen fluoride etching. The nanotubes prepared can have a nanometer size diameter, and a length of several meters or longer. Preferably, a vacuum pump is connected to the glass tube, and the drawing is done in vacuum to avoid the possible oxidation of the filling materials and to make an intimate contact between the glass and the filling materials.

Any suitable material can be used as the filling material in the preform. Preferably, the softening temperature of the glass is between the melting temperature and the boiling temperatures of the filling material. Preferably, the coefficients of thermal expansion of the glass and the filling material at the drawing temperature are close to each other, or the filling material is in liquid. Preferably, there is substantially no chemical reaction between the glass and the material at the drawing temperature. Preferably, the molten material has certain wettability to the glass surface. Preferably, the materials do not have high vapor pressure at high temperature.

The drawn nanotubes can be etched and/or coated using any suitable methods. For example, the drawn nanotubes can be etched and coated as described in U.S. Patent Publication No. 2006/0289380, the entirety of which is hereby incorporated by reference.

Electroluminescence and Photovoltaic Responses of Polymer Nanotubes-Containing Nanocomposites The nanostructures prepared according to the present disclosure can also be used to form polymer transparent conductive composites. In one embodiment, an organic electrical device is provided having a polymer conductive nanostructure composite that displays electroluminescent properties, hence being suitable for organic light emitting diode (OLED) device applications, or displays photovoltaic properties, hence being suitable for organic photovoltaic (PV) devices, in which the concentration of conductive nanostructures present in the polymer matrix of the polymer conductive nanostructure composite dictates whether the organic electrical device displays electroluminescent properties or photovoltaic properties.

In one embodiment, organic photovoltaic devices or organic light emitting devices are composed of a polymer matrix and a network of conductive nanostructures having high aspect ratios, i.e., ratio of length to diameter, which include, but at not limited to, nanoribbons, such as carbon or ZnO nanoribbons; nanorods, such as ZnO nanorods doped with F, N, or $In_2O_3$ nanorods doped with Sn; or nanocylinders, such as single walled nanotubes, double wall nanotubes, few wall nanotubes, or multi-wall nanotubes. In one embodiment, the material of the nanostructures could be carbon and/or a metal oxide that is doped to increase conductivity, for example doped with small molecules or metal ions. Although, carbon nanotubes are discussed from this point forward, it is noted that the present disclosure is applicable to other conductive nanostructures and geometries.

The polymer matrix may be composed of any polymer material that emits light in response to an electric current or an electric field, examples of which include, but are not limited to, poly(phenylene vinylene), polythiophenes, polypyridines, poly(pyridyl vinylenes), polyphenylenes and copolymers of these materials. In one embodiment, the polymer is a conjugated polymer. Conjugated polymers have a framework of alternating single and double carbon-carbon and/or carbon-nitrogen bonds or carbon-sulfur bonds.

In one embodiment, the incorporation of carbon nanotubes into the polymer matrix improves the light-emitting (electroluminescence) and photovoltaic response of composite polymers by facilitating charge injection and dissociating excitons, respectively. In one embodiment, carbon nanotubes are either present in a network of carbon nanotube or are present in a vertically aligned array to allow for greater volumes of polymers to be accessed for more efficient electroluminescence or photovoltaic operation. Polymers and networks of carbon nanotubes when combined create interfaces of nanometer dimensions, which permit efficient charge separation or injection along the high surface area networks for increased efficiency of electroluminescence or photovoltaic operation as compared to either component by itself. Examples of a network of carbon nanotubes through a polymer matrix of an organic electrical device are described in U.S. Patent Publication No. 2008/0191606, the entirety of which is hereby incorporated by reference.

In one embodiment, an organic electrical device is configured to provide an organic light emitting diode (OLED). Electrons and holes can be easily injected into carbon nanotubes due to the low work function of carbon nanotubes relative to that of the polymer matrix or the electrodes. In one embodiment, the work function of the carbon nanotubes may range from about 4.5 eV to about 3.2 eV. In one embodiment, the work function of the polymer may range from about 5.0 eV to about 6.0 eV.

In one embodiment, charge transport from the carbon nanotubes to the chains of the polymer matrix can occur at lower bias (lower turn on voltage) due to the smaller potential barriers between the nanotubes and polymer chains. In one embodiment, nanotube-facilitated charge injection may occur at both forward and reverse biases, leading to polymer electroluminescence. As a consequence, this cascade injection process can greatly enhance charge injection in organic light-emitting diodes. In one embodiment, the turn on voltage of an organic electric device in forward bias that is produced may range from about 2 V to about 8 V. In another embodiment, the turn on voltage of an organic electric device that is produced in reverse bias may range from about 6 V to about 16 V. In one embodiment, the incorporation of carbon nanotubes to the polymer matrix increases electroluminescence when present in a concentration greater than about 0.0 wt % and less than about 0.1 wt %.

In one embodiment, an organic electrical device is configured to provide an organic photovoltaic device. The use of carbon nanotubes can introduce donor-acceptor interactions between nanotubes and polymeric chains of the polymer matrix. In one embodiment, the donor-acceptor interaction can effectively dissociate the photoexcitation-generated excitons for the generation of charge carriers. At high concentrations, nanotubes can contribute to the photocurrent of the system due to their light absorption and exciton generation capabilities. Additionally, the carbon nanotubes can also transport dissociated charge carriers for the generation of photocurrent. In one embodiment of the organic electrical device, the carbon nanotubes improve photovoltaic response, wherein as the concentration of the carbon nanotubes increases to approximately 0.20 wt %, the photovoltaic response increases.

In one embodiment, it is provided enhanced optimal electroluminescence in organic light emitting diodes (OLED) at nanotube concentrations at about the electrical conductivity percolation threshold. In one embodiment, the nanotube concentration is selected to provide that the electrons and holes recombine in the polymer matrix with the highest efficiency of light emission and with minimum losses to secondary processes, such as annihilation and non-radiative relaxation, exciton and charge carrier trapping at defect sites etc. In one embodiment, the nanotube concentration is the minimum percolation threshold that provides electrical communication through the polymer matrix between the positive electrode and the negative electrode of the organic electrical device.

In one embodiment, the percolation threshold is the minimum concentration of carbon nanotubes for which current begins to flow through an insulating matrix (in this case, a poorly "conducting" polymer). In one embodiment, above percolation threshold, the charge is carried principally by the carbon nanotubes. In one embodiment, just below percolation threshold, charge is carried into regions of the polymer matrix that is otherwise inaccessible due to the high resistance of the polymer matrix, wherein the charge conduction pathway includes both conduction through the polymer matrix, and charge conduction through the network of conducting carbon nanotubes.

In one embodiment, just below the percolation threshold represents the regime of maximal charge injection and interaction with the polymer matrix that provides the greatest electroluminescent response. In one embodiment, at higher nanotube concentrations (above the percolation threshold), the proximity of nanotubes within an exciton diffusion path length results in effective dissociation of excitons at the nanotube-polymer interface and charge collection, thereby competing with electroluminescence and enabling efficient photovoltaic operation.

Figure 8:
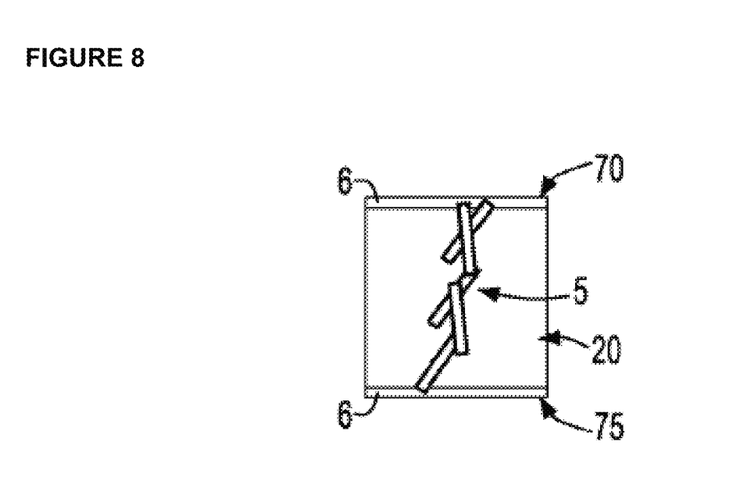
FIG. 8 is a top view of an organic electrical device that includes a polymer composite.

Referring to FIG. 8, an organic electrical device is provided that includes a polymer composite including a first plurality of carbon nanostructures 5 positioned in a polymer matrix 20; and a positive electrode 70 and a negative electrode on 75 at opposing sides of the polymer composite. At least one of the positive electrode and the negative electrode includes a carbon nanotube mat 6 composed of a second plurality of carbon nanostructures. The second plurality of carbon nanostructures includes a dopant to provide the at least one of the positive electrode and the negative electrode with a work function substantially equal to a work function of the polymer matrix 20. In one embodiment, carbon nanotube mats 6 enhance charge injection into the polymer matrix 20, permitting both electrons and holes to be injected, hence lowering the turn on voltage of the device and increasing the brightness of the device.

In one embodiment, a transparent carbon nanotube mat 6 is provided as a conformable electrode for the organic electric device, such as an organic light emitting diode. In one embodiment, in order to maintain transparency, the thickness of carbon nanotube mat 6 is provided at less than about 100 nm. In another embodiment, the thickness of carbon nanotube mat 6 ranges from about 100 nm to about 20 nm. In one embodiment, both of the electrodes of the organic electrical device are composed of transparent carbon nanotube mats. In another embodiment, the electrode positioned on the portion of the organic electric device, i.e., organic light emitting diode, that emits light, wherein the opposing electrode includes a reflective surface that may serve as a mirror to direct light. In one embodiment, the carbon nanotubes that provide the electrodes of the device may penetrate into the polymer matrix and provide the network of carbon nanotubes that provides electrical communication between the electrodes through the polymer matrix.

Applications for organic electrical devices including polymer composites composed of nanotube arrays include, but are not limited to, chemical sensors, light sensors, photochemical sensors, and redox sensors. It is noted that the above applications are illustrative, not limiting, as further applications have been contemplated and are within the scope of the present invention.

In addition to the above-described manufacture of carbon nanotubes, any suitable other manufacturing methods for providing carbon nanotubes can be used. In one embodiment, the carbon nanotubes are positioned in a vertically aligned array. In one embodiment, the vertically-aligned nanotube arrays (VANTAs) can be synthesized by thermal chemical vapor deposition of hydrocarbon feedstock onto substrates that are patterned with metal catalyst films. In one embodiment, thermal chemical vapor deposition synthesis is achieved by providing a carbon source in a gas phase and using an energy source, such as a plasma or resistively heated coil, to transfer energy to a gaseous carbon molecule. Examples of chemical vapor deposition processes suitable for forming carbon nanotubes include, but are not limited to, plasma enhanced chemical vapor deposition (PECVD), thermal chemical vapor deposition (CVD), vapor phase growth, aero gel supported chemical vapor (CVD) and laser assisted chemical vapor deposition.

In one embodiment, the patterned metal catalyst films are composed of a single layer or multi-layers of thin metal films that are deposited by electron beam evaporation, sputtering, or chemical vapor deposition. In one embodiment, the metal catalyst film may include a transition metal including, but not limited to, Ni, Fe, or Co. In one embodiment, following deposition the metal catalyst film is patterned using photolithography and etching processes. The metal catalyst film may be patterned to provide dots patterns, pillars, stripes, and/or functional structures, such as sensor structures.

In one embodiment, the patterned metal catalyst film includes a buffer layer, e.g., Al, which is in contact with the substrate, and a metal catalyst, e.g., 0.2-1.0 nm of Fe formed atop the buffer layer. In one embodiment, the patterned metal catalyst film includes another metal layer, such as 0.2 nm of Mo.

While the present disclosure has been described with reference to certain embodiments, other features may be included without departing from the spirit and scope of the present invention. It is therefore intended that the foregoing detailed description be regarded as illustrative rather than limiting, and that it be understood that it is the following claims, including all equivalents, that are intended to define the spirit and scope of this invention.

The invention claimed is:

1. An electronic device, comprising:
   a plurality of drawn glass tubes having opposing ends, wherein the plurality of drawn glass tubes are bundled;
   a semiconductive material disposed inside of the drawn glass tubes, the semiconductive materials comprising a semiconductive polymer composite, the coefficients of thermal expansion of the glass tubes and the semiconductive polymer composite at the drawing temperature of the glass tubes being close to each other such that the glass tubes and the semiconductive polymer composite are capable of being co-drawn, where the semiconductive polymer composite comprises a polymer matrix and a network of conductive nanostructures disposed in the polymer matrix; and
   a first electrode and a second electrode disposed at the opposing ends of the individual drawn glass tube,
   where the conductive nanostructures are positioned such that the concentration of the conductive nanostructures is from less than a percolation threshold to greater than the percolation threshold, and
   where the conductive nanostructures provide electrical communication between the first and second electrodes.

2. The electronic device of claim 1, wherein the individual drawn glass tube has a diameter of less than about 100 nm.

3. The electronic device of claim 1, wherein the first electrode and the second electrode are non-transparent.

4. The electronic device of claim 1, wherein the network of conductive nanostructures increases the light-emitting response of the polymer composite.

5. The electronic device of claim 1, wherein the network of conductive nanostructures increases the photovoltaic response of the polymer composite.

6. The electronic device of claim 1, wherein the semiconductive material substantially fill the inside of the drawn glass tube.

7. The electronic device of claim 1, wherein the semiconductive material is disposed on the inner wall of the drawn glass tube and there is an empty space inside of the drawn glass tube with the semiconductive material disposed thereupon.

8. The electronic device of claim 1, wherein the first electrode is a cathode, and the second electrode is an anode.

9. An electronic device, comprising:
   a drawn glass tube having opposing ends;
   a semiconductive material disposed inside of the drawn glass tube, the semiconductive materials comprising a semiconductive polymer composite, where the semiconductive polymer composite comprises a polymer matrix and a network of conductive nanostructures disposed in the polymer matrix;
   a first electrode disposed inside of the drawn glass tube with the semiconductive material disposed thereupon; and
   a second electrode disposed outside of the drawn glass tube,
   wherein the second electrode surrounds both the drawn glass tube and the first electrode disposed inside of the drawn glass tube, where the conductive nanostructures are positioned such that the concentration of the conductive nanostructures is from less than a percolation threshold to greater than the percolation threshold, and where the conductive nanostructures provide electrical communication between the first and second electrodes.

10. The electronic device of claim 9, wherein the network of conductive nanostructures increases the light-emitting response of the polymer composite.

11. The electronic device of claim 9 wherein the network of conductive nanostructures increases the photovoltaic response of the polymer composite.

12. The electronic device of claim 9, wherein the first electrode and the second electrode are non-transparent.

13. The electronic device of claim 9, wherein the first electrode and the second electrode are transparent.

14. The electronic device of claim 9, wherein the first electrode is a cathode, and the second electrode is an anode.

15. The electronic device of claim 9, further comprising a donor material and an acceptor material disposed between the first electrode and the inner wall of the drawn glass tube, the donor material adjacent to the first electrode.

* * * * *